April 28, 1964 G. KRSEK ETAL 3,131,098

EPITAXIAL DEPOSITION ON A SUBSTRATE PLACED IN A SOCKET OF THE CARRIER MEMBER

Filed Jan. 31, 1961

INVENTORS
WALTER C BENZING
GEORGE . KRESEK

BY Walter Katz
ATTORNEY

United States Patent Office 3,131,098

Patented Apr. 28, 1964

3,131,098

EPITAXIAL DEPOSITION ON A SUBSTRATE PLACED IN A SOCKET OF THE CARRIER MEMBER

George Krsek and Walter C. Benzing, Mountainside, N.J., and Benjamin Topas, Santa Monica, Calif., assignors to Merck & Co., Inc., Rahway, N.J., a corporation of New Jersey Filed Jan. 31, 1961, Ser. No. 86,239
6 Claims. (Cl. 148—175)

This invention relates to a method and apparatus for the formation of single crystal semiconductor bodies comprising a plurality of layers having different conductivities separated by a transition region, at least one of such layers being deposited from a vapor source of such material, and more particularly to a technique for simultaneously forming a plurality of uniform semiconductor bodies of substantial area and planarity.

This application is a continuation-in-part of application Serial No. 65,100, filed October 26, 1960.

Semiconductor devices comprising at least two layers of semiconductor material having different conductivities and separated by a transition zone have been well recognized in the art for the performance of an active function in an electrical circuit. To this point, there have been developed three methods of forming a transition zone, or junction, within a semiconductor body which are considered as being successful from a reproducible commercial standpoint. In all instances, for the most satisfactory semiconductor devices the starting material for the formation of a body containing a junction is a body of single crystal semiconductor material such as silicon, germanium or a compound of a group III and a group V metal such as gallium arsenide, indium phosphide, etc. The initial semiconductor body may be intrinsic, that is, not possessing appreciable active impurity atoms to impart to the body a specific type of electrical conductivity or, alternatively, the initial body may contain such active impurity atoms rendering thereto a predetermined electrical conductivity of either P or N type.

One common method of forming a P-N junction within such a semiconductor body is the alloying or fusion technique. In this process, a semiconductor body is contacted with a source of active impurity atoms as, for example, aluminum (in the case of silicon) or indium (in the case of germanium). A disk or pellet of aluminum is placed on a wafer of an N-type silicon semiconductor crystal. The assembly is then heated to a temperature above the eutectic temperature of aluminum and silicon but below the melting temperature of silicon. The body is then cooled and a P-type regrowth region of silicon containing the thermodynamic equilibrium solubility content of aluminum is formed. By this process the P-type regrown region is separated from the initial N-type body by a P-N junction. It may be seen that the alloy process has the limitation of not permitting control of the degree of conductivity of the regrowth region since the conductivity is fixed by the solid solubility of active impurity atoms in the regrown silicon region which, of course, is in turn determined by the segregation constant of silicon and aluminum.

The second common technique for the formation of junctions is known as the diffusion technique. In this instance, a solid or vapor source of active impurity atoms is placed in contact with the semiconductor body. The assembly is then heated to a high temperature but below the melting point of the semiconductor (i.e., heated to 1250° C. for silicon) and for a long period of time to cause the active impurity atoms to diffuse into the semiconductor body by physical migration and diffusion through the crystal lattice. The diffusion of the atoms follows a fixed distribution pattern with respect to the number of active impurity atoms present at any distance into the semiconductor body and the total distance for diffusion of any active impurity atoms. This distribution pattern has been established for known semiconductor materials with respect to known active impurity materials. The functional relation is described by Fick's law and by complementary error function curves for the respective materials at the temperatures involved. As may be appreciated, diffusion junctions have the disadvantage, in common with alloy junctions, that the number of active impurity atoms and position thereof within the semiconductor body are not variable at will since the active impurity atoms in a diffused junction must follow a physical distribution curve which is not within the control of the operator. This distribution curve also renders it difficult to accurately position a sharp transition region within the semiconductor body.

A third method of forming a junction within a semiconductor body is known as the grown junction technique. Unlike alloying and diffusion, in the grown junction technique the crystal of semiconductor material, together with occluded active impurity atoms, is formed from a molten mass thereof by pulling a single crystal by known techniques. At some stage of pulling the crystal, additional active impurity atoms of a type giving a conductivity of a type opposite to that in the initially formed crystal are added to the melt in quantities sufficient to change the conductivity type of the semiconductor body area next pulled from the melt. As is immediately apparent, the number of active impurity atoms added to the melt must be sufficient to compensate the number of opposite-type impurity atoms initially present in the melt and the formation of uncompensated conductivity layers is not possible after the first-formed layer. It is also apparent that the junction will be produced somewhere within a grown crystal transverse to the axis of formation thereof and requires special equipment to locate the junction at a desired point. Since relatively thin layers of semiconductor material of differing conductivities with a transition region therebetween are normally used for device manufacture, considerable excess of semiconductor material is formed on either side of the junction, necessarily resulting in waste thereof. It is, therefore, apparent that this method of junction formation has not been commercially successful to any appreciable degree.

The foregoing methods of forming a transition region, i.e., the delineation between two layers of differing conductivities in either degree, e.g., N+-N, or in type, e.g., P-N, have been commonly employed in the formation of various structures, such as diodes, transistors, switches and the like. One of the important structures desired for fabrication is, for example, the structure commonly called an NPIN transistor. A common method of manufacturing such a device is to provide a wafer of relatively high resistivity N type semiconductive material, such as silicon. A P region is diffused into the top surface of such a wafer after suitable surface preparation by lapping, etching, etc., and thereafter an N layer is diffused into the thus formed P layer. Ohmic contacts are made to the lower surface of the initial N wafer, which becomes the collector of the transistor; to the P layer, which is the base; and to the diffused N layer, which is the emitter. Conventionally, the NPIN nomenclature uses "I" (for "intrinsic") to designate the high resistivity wafer, and the last "N" of the nomenclature refers to the lower resistivity area at the ohmic contact position on the original wafer. As may be appreciated, the original wafer to which the operations discussed above are applied must have substantial thickness merely for structural strength. This appreciable thickness is a detriment in the structure of an NPIN transistor since the thickness in what becomes the collector region causes undesirable series resistance in the structure. It is, of course, impossible, though obviously desirable, to provide an $N^+$ wafer by diffusion or alloying techniques, then form a higher resistivity N layer above a lower resistivity $N^+$ layer, and thereafter form the P and N layers comprising the base and emitter, respectively. Techniques of "out diffusion" by starting with an $N^+$ wafer and removing some impurity atoms from the upper surface thereof to form an N layer have been tried without acknowledged success.

That this same problem of providing a high resistivity layer intermediate in a semiconductor body structure is applicable to structures other than the NPIN transistor, is apparent.

Accordingly, it is an object of this invention to provide a semiconductor body having at least two layers of a semiconductor material with a transition region therebetween, wherein the specific conductivities of each region at any point thereof are controlled, wherein the transition region is accurately positioned within the semiconductor body, and wherein the transition region is provided with substantial area and planarity.

It is a further object of this invention to provide apparatus for the formation of a plurality of uniform semiconductor bodies having a plurality of layers of semiconductor material of known and controlled conductivity types and degrees, at least one of such layers resulting from the simultaneous in situ deposition of semiconductor material and active impurity atoms in a crystalline relationship to each other.

It is another object of the invention to provide a method of making simultaneously a plurality of uniform semiconductor bodies of substantial area and planarity having a plurality of layers of different conductivities with transition regions therebetween, at least one of such layers being intermediately positioned within the body and having low conductivity characteristics.

Still another object of the instant invention is to provide a method of simultaneously forming a plurality of semiconductor bodies having a plurality of layers of single crystal semiconductor material having different conductivities and separated by a transition region by vapor deposition of a decomposable vapor of semiconductor atoms and active impurity atoms maintained in a turbulent condition in a vapor mixing chamber, which includes the step of providing a plurality of wafers of single crystal semiconductor material having a predetermined conductivity type and degree on a support within the chamber, and thereafter heating the support to effect deposition thereon of a single crystal layer of the semiconductor atoms and active impurity atoms having a conductivity different from that of the wafer.

Among the other objects is to provide an apparatus for for simultaneously producing a plurality of uniform semiconductor transition devices by in situ deposition of a decomposable vapor of semiconductor atoms and active impurity atoms maintained in a turbulent condition in a vapor mixing chamber, which apparatus includes a resistive conducting support having a plurality of sockets therein positioned within the chamber, a plurality of wafers of single crystal semiconductor material positioned in the sockets, and a source to heat the support through resistance, thereby to heat the wafer by heat from the support to effect deposition in the chamber of a layer of semiconductor material and active impurity atoms having a conductivity different from that of the wafer.

These and other objects of the invention will become apparent from consideration of this disclosure read in conjunction with the accompanying drawings wherein.

In general, this invention includes the method of simultaneously forming a plurality of uniform semiconductor bodies having a plurality of layers of single crystal semiconductor material having different conductivities either in type or degree and separated by a transition region, which includes the steps of providing a plurality of wafers of single crystal semiconductor material, positioning the wafer on a conducting support, positioning the assembly within a reaction chamber, heating the support thereby heating the wafers by heat from the support, contacting the heated wafer with a decomposable vapor comprising semiconductor atoms and active impurity atoms, causing said vapor to flow turbulently about the heated wafers and effecting deposition of the atoms from the vapor to form a single crystal layer of semiconductor material having different conductivity from that of the wafer on which deposition occurs. Preferably, a plurality of wafers are fabricated in such a manner simultaneously by the provision of resistance-heated supports on which are provided receptacles or sockets for a plurality of wafers to be treated, and by the control of vapor conditions within the reaction chamber to effect substantially uniform deposition on the plurality of wafers treated.

The foregoing process may be employed in the formation of semiconductor bodies of known semiconductor materials with the only criterion being that a decomposable vapor source of the material be available. The terms "thermally decomposable," "thermal decomposition" and the associated deposit of a product of decomposition, as used herein, are intended to be generic to the mechanisms of heat-cracking as, for example, the decomposition of silicon tetrachloride and liberation of silicon atoms through the action of heat alone and the mechanism of high temperature reactions wherein the high temperature causes interaction between various materials with liberation of specific materials or atoms as, for example, the reaction of $$3SiHCl_3 + H_2 \xrightarrow{\Delta} 2Si + SiCl_4 + 5HCl$$

used in the preferred embodiments of this invention as hereinafter indicated. For the sake of illustration, the following detailed description of apparatus used and product obtained relates to the use of the invention in the formation of single crystal silicon semiconductor bodies.

Figure 1:
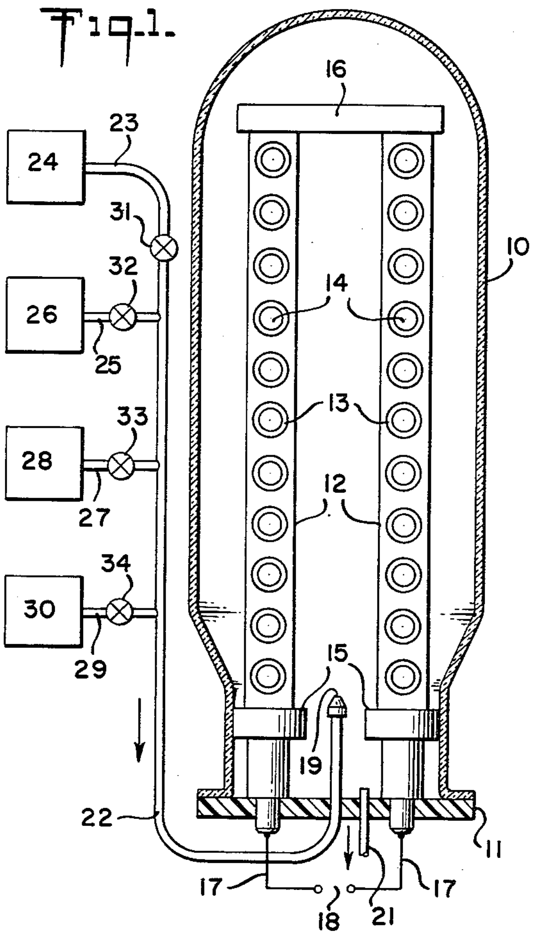
FIGURES 1 and 2 illustrate a suitable apparatus for carrying out the method of the present invention.
Figure 2:
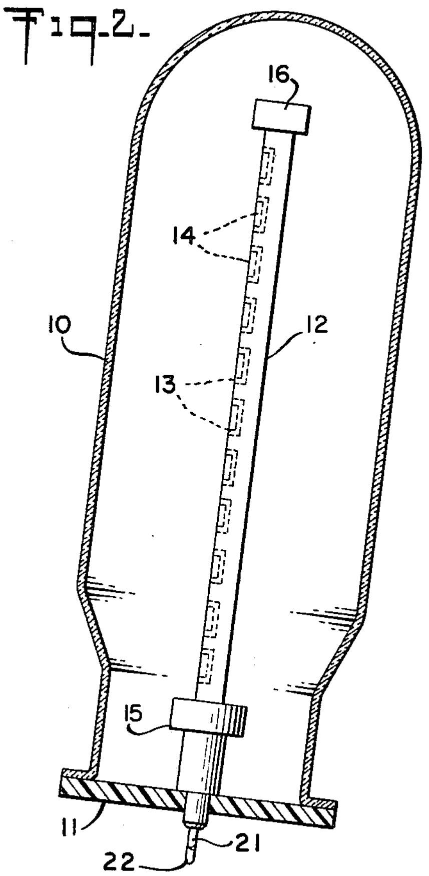

Referring particularly to FIGURES 1 and 2, there are schematically illustrated a suitable apparatus for use in this invention. Generally, there is presented in FIGURE 1 a bell jar 10 sealed to a base 11 in order to form a closed reaction chamber. An appropriate number of relatively high resistivity conducting supports 12, provided with sockets 13 for wafers 14, more particularly defined hereinafter, are mounted within the bell jar. Supports 12 are mounted within electrically conducting mounting chucks 15 at the lower end thereof and a conducting bridge 16 between the supports is provided. Leads 17 are attached to the electrically conductive chucks 15 and are provided with terminals 18 to which a source of electrical energy (not shown) may be connected to supply electric current flow through the supports 12 in order to heat them, as will be more fully described hereinafter. An entry port for reaction gases is provided by nozzle 19 which extends above the base 11 and into the interior of the reaction chamber formed by bell jar 10. An exhaust port 21 extends through base 11 in order to permit the removal of spent reaction gases from the chamber. Nozzle 19 is connected to conduit 22 extending through the base 11. Conduit 22 connects with the sources of vapors to be fed into the reaction chamber. Conduit 23 connects conduit 22 with a source of a carrier gas 24. Conduit 25 interconnects conduit 22 to a vapor source of semiconductor material 26. Conduit 27 interconnects conduit 22 with a vapor source of active impurity atoms 28 and conduit 29 interconnects conduit 22 with a source of flushing gas 30. Valves 31, 32, 33 and 34 are utilized to open or close each of the conduits individually, as will be more fully explained hereinafter.

It will be appreciated that the arrangement of apparatus illustrated in FIGURES 1 and 2 is substantially schematic for ease in understanding the process of this invention and that various assemblies of line and valves for feeding reaction gases to the reaction chamber may be provided in many differing configurations consistent with good engineering practices.

The procedure of the invention employing the apparatus of FIGURES 1 and 2 is as follows. The supports 12 to be used in the apparatus are prepared from electrically conductive material of high resistance which exhibits the characteristic of becoming heated due to the passage of electrical current therethrough. Materials such as silicon, conducting ceramics such as silicon carbide, graphite, refractory metals like tantalum, molybdenum or titanium may be employed. Obviously, the supports must be of a material which does not contain impurity atoms, or at least, does not interact with the system by introduction of impurity atoms. The dimensions of the supports should be adequate to enable sockets or receptacles for the wafers to be treated to be made in the surface of the support. As indicated in FIGURE 1, a plurality of such receptacles are normally used and the dimensions of the receptacle may be, for example, 1" in diameter and .050" in depth. The wafers 14 may be prepared in any suitable manner as, for example, by slicing or cutting wafers from commercially available zone refined single crystals of semiconductor material, both of which are known in the prior art. The wafers are cut in such a manner that the surface of the wafer to be treated is oriented in a specific crystallographic plane. In the preferred embodiments, the crystallographic plane on the surface of the wafer to be treated is a 111 plane. Other orientations of the planes on which growth will occur may be used, such as

{100} {110} {211}

The surface of the wafer on which growth will occur is carefully prepared by common techniques of grinding, polishing and etching.

Individual wafers are inserted in the receptacles therefor in the supports 13 and the supports mounted in the reaction chamber. As shown in FIGURE 2, the exposed surfaces of the wafers are substantially aligned with the outer surface of the support; thereby both the wafers and the support receive about the same amount of deposit thereon during vapor deposition and the aligned relationship between the two remains the same during the deposition.

The supports 12 with wafers 14 positioned thereon are mounted in chucks 15 within the reaction chamber 10 and the electrically conducting bridge 16 is connected thereto. The supports are then heated by connecting the source of electrical energy (not shown) to terminals 18 so that current flow passes through the supports 12 and bridge 16. As the current flows through the supports 12, their temperature is raised. Since silicon has a negative resistance temperature coefficient, that is, a high resistance to passage of electrical energy (when cold), it is preferable to initially heat silicon supports, for instance with a source of radiant energy imported through the walls of the reaction chamber. For simplicity of illustration, such heating means are not illustrated in FIGURE 1.

Continued heating of the supports 12 causes heating of the wafers 14 through heat conductance. As may be appreciated, this mode of heating the wafers fulfills the important requirement that the wafers are heated uniformly within the reaction chamber.

Current flow is continued until the wafers are initially heated to a temperature of the order of about 1250° C. (All temperatures indicated herein were determined by optical pyrometer observation of the wafers.) At this point, valve 31 is opened and the carrier gas alone is permitted to flow through conduits 23 and 22 through the nozzle 19 and into the interior of the reaction chamber 10 as a free jet of gas. This free jet principle of gas flow serves to provide substantial turbulence of gas in the reaction or vapor mixing chamber, an essential characteristic of this process for the treatment of a plurality of wafers. Turbulent gas flow also may be effected by a mechanical gas stirrer or by maintaining the wall of the reaction chamber at a temperature which is considerably below the temperature of the support.

In the presently preferred embodiment of this invention wherein the formation of a silicon layer on the wafer is being described, the carrier gas is preferably hydrogen. At the temperature indicated, the hydrogen serves to cleanse the surface of the wafers, preparing them for single crystal growth. Regardless of the degree of care taken in the preparation of the initial seed crystals, it is believed that some oxidation of the surface thereof occurs from their exposure to the atmosphere and the flow of hydrogen gas at the temperature involved apparently removes these oxidized layers. Regardless of the theory involved, the surface treatment of silicon with hydrogen gas does enable subsequent single crystal growth.

After a period of time adequate to insure a clean surface, normally 30 minutes to an hour, the temperature of the wafers is adjusted to the temperature adequate to provide thermal decomposition of a vapor source of semiconductor atoms. In the presently preferred embodiment of this invention the source material for silicon atoms to be used in crystal growth is silicochloroform (trichlorosilane) although other halides such as silicon tetrachloride, silicon tetrabromide, etc. and silane itself may be employed with appropriate adjustments made in temperature, gas mol ratios, flow rates, etc. The optimum temperature of the seed crystals when silicochloroform is used has been found to be approximately 1170° C. In further proceeding, the carrier gas, hydrogen, from its source 24 is mixed with the silicochloroform from source 26 by feeding the latter to conduit 22 through valve 32.

The hydrogen is admixed with silicochloroform and fed through conduit 22 into the reaction chamber 10 through the nozzle 19. At the same time, appropriate quantities of a vapor source of active impurity atoms are fed from source 28 and through conduit 27 and valve 33 to the flow of hydrogen and silicochloroform through conduit 22 in all instances where such impurities are desired in the layer being formed. All of the vapor feeding is, of course, controlled through the appropriate valves illustrated as controlling the respective feed lines. As will be appreciated, to ensure single crystallinity of the grown crystal from the thermally decomposable sources of semiconductor material and active impurity atoms there is required a balance between the temperature at the surface of the wafer, the flow rate of reaction gases through the chamber, and the mol ratios of vapors, i.e., the carrier gas, the vapor source of semiconductor atoms and the vapor source of active impurity atoms. Too low a concentration of vapor source for semiconductor atoms will result in low deposition rates, below those commercially practical. Too high or too low a temperature or too high a concentration of vapor source for semiconductor atoms will result in polycrystalline growth from temperature alone or too great a supply of semiconductor atoms deposited on the crystal, thereby preventing orientation of the atoms in an orderly arrangement thereof. The concentration of vapor source of active impurity atoms, while small in relation to the total gas flow, must be adequate to result in the desired conductivity in the formed crystal.

As heretofore indicated, a temperature of the seed crystal of the order of 1170° C. is optimum when used with a vapor of approximately 240 grams of silicochloroform per hour entrained in 5.5 liters per minute of total gas flow through the reactor. This mixture results in a mol ratio of silicochloroform to hydrogen of approximately 0.12, and variations of this mol ratio within a range of approximately 0.015 to 0.30 and preferably 0.06 to 0.20 may be employed in the case of silicochloroform and hydrogen. Under these temperature and flow rate conditions in the process described approximately 11 grams per hour of silicon is deposited. As is apparent, the amount of vapor source of active impurity atoms can be mathematically related to the silicochloroform weight introduced into the reaction chamber to obtain desired conductivities.

Gas flow into and through the reaction chamber is continued to form a layer of atoms of semiconductor material, silicon, and if desired, active impurity atoms (for example, boron, if P-type material is desired) in a crystalline relation resulting from the codeposition of the atoms as decomposition products of the vapor sources thereof in reaction contact with the then-existing crystalline surface.

Figure 3:
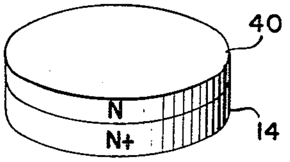
FIGURES 3 and 4 illustrate a semiconductor body formed in accordance with the method of the present invention.

Deposition is continued until the vapor-deposited layer 40 grows to the desired thickness, and the product exhibits the form illustrated in FIGURE 3. As hereinafter described, this product may be recovered and used for the manufacture of semiconductor devices. Alternatively, additional layers of differing conductivities may be formed on the wafer.

If a structure comprising a plurality of layers of in situ deposited conductivity layers is desired, the silicon wafers thus far formed, of the structure illustrated in FIGURE 3, are disassociated from any excess active impurity atoms present within the reaction chamber 11 and not within the structure of the crystals themselves. In the preferred embodiment, a gas flow procedure employing a vapor reactive with such impurities is employed. It is possible, of course, to remove the wafers thus formed to a second reaction chamber, although commercial considerations may dictate otherwise. This dissociation procedure is used in any instance where in the next-formed layer of semiconductor material a relatively low conductivity is desired. If high conductivity material is to be next formed on the crystal, the dissociation may be dispensed with since the number of active impurity atoms fed in the gas stream for deposition on the crystal to form the high conductivity layer will be in quantity adequate to overpower the characteristics which the excess impurity atoms left in the system might impart to the next-formed layer.

Additional layers of single crystal semiconductor material may be desposited on the thus-formed wafers in manner similar to that described above with respect to the first-formed layer. Appropriate changes will be made in the source of active impurity atoms from source 28 in either type of active impurity atoms or quantity thereof fed to the flowing reaction gas stream, or a combination of both, dependent upon the type of layer desired and the desired conductivity thereof.

The sources of active impurity atoms are, as heretofore indicated, thermally decomposable volatile compounds of those elements known in the art to alter the intrinsic electrical properties of the semiconductor material by acting as donors or acceptors in semiconductor bodies. Such elements include, in the case of silicon, boron, aluminum, gallium, phosphorus, arsenic, antimony, as is known. In bodies of semiconductor material other than silicon the donor and acceptor elements known to be appropriate therefor are used. Ideal success has been had with the use of boron trichloride in the formation of P-type layers, and phosphorus trichloride in the case of N-type layers, and because of ease of handling these materials in the process, they are preferred for appropriate silicon doping in commercial embodiments of this invention.

As an example of a specific semiconductor device which may be formed in accordance with the method of the present invention, an NPIN high voltage semiconductor transistor may be formed as follows. A plurality of silicon wafers having an N-type conductivity of about 0.002 ohm centimeters and a diameter of approximately ¾ of an inch and a thickness of about 5 mils are supported within the supports 12 which are, in turn, mounted in the reaction chamber 10 as shown. The wafers are initially treated by flowing carrier gas, in this case hydrogen, through nozzle 19 into the reaction chamber 10 at a rate of 5 liters per hour, for a period of about 30 minutes. Thereupon, a mixture of approximately 240 grams per hour of silicochloroform and 330 liters per hour of hydrogen carrier gas along with sufficient phosphorus trichloride to provide approximately $10^{15}$ carriers per cc. of silicon is introduced into the reaction chamber. By maintaining the temperature at the surface of the silicon starting element at approximately 1170° C., a deposition rate of between 10 and 11 grams per hour of silicon along with atoms of phosphorus are deposited upon the silicon wafers. These conditions are maintained for approximately 3 minutes to produce a 5 to 8 micron-thick layer upon the surface of the starting element. This layer of N-type single crystal silicon has a resistivity of approximately 1–10 ohm centimeters and is separated from the $N^+$ layer formed by the original wafer by a transition region.

There is thus formed the $N^+$-N wafer illustrated in FIGURE 3. From this wafer can be fabricated the NPIN transistor illustrated in FIGURE 4. The crystal body for such a device may be fabricated by diffusing a P layer into the vapor-deposited N layer by conventional diffusion techniques. For example, the wafer may be exposed to a vapor of hydrogen and $BCl_3$ for a period of approximately one hour at a temperature of 1100° C. P-layer of 2–3 microns in thickness, having a resistivity of 10 ohm centimeters will be thus formed. Subsequent fabrication of the device will be described hereinafter.

If it is desired that the P layer be provided on the crystal body in the form of a vapor-deposited conductivity layer, the wafer is not removed from the reaction chamber and growth of the wafer is continued in the following manner: after the deposition of the N layer, a mixture of reaction gas containing 240 grams per hours of silicochloroform with 330 liters per hour of hydrogen along with sufficient boron trichloride to provide $10^{14}$ carriers for cc. of silicon is introduced into the reaction chamber under the conditions as above outlined. This will provide a deposition rate of between 10 and 11 grams per hour. These conditions are maintained for approximately 3 minutes in order to provide a 2–3 micron thick layer of P-type semiconductor single crystal material having a resistivity of approximately 10 ohm centimeters. This layer of single crystal P-type material is separated from the previously-deposited N-type layer of material by a very sharp, well-defined P-N junction.

The source of reaction gas is then removed from the reaction chamber and the wafers are permitted to cool at a rate of approximately 100° per minute after which they are removed from the reaction chamber.

Figure 5:
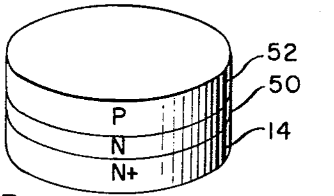
FIGURES 5 and 6 illustrate the formation of semiconductor elements from the semiconductor bodies formed in accordance with this invention.
Figure 6:
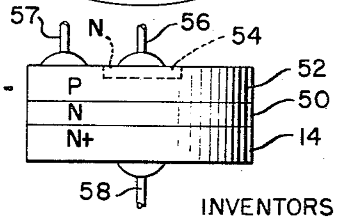
Figure 4:
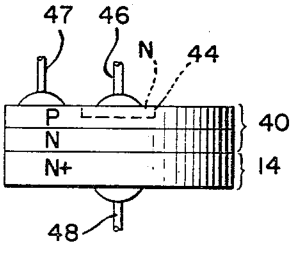

The wafers containing the original $N^+$ layer, from the original wafer; the high resistivity N layer, from vapor deposition; and the P layer, either from diffusion into the crystal illustrated in FIGURE 3 or by a deposition thereof as illustrated in FIGURE 5, may be further fabricated to form the devices illustrated in FIGURES 4 and 6. The P layer is suitably masked and the wafer exposed to a vapor of arsenic for a period of approximately one hour at a temperature of 1100° C. With such treatment, the N regions, indicated as 44 in FIGURE 4 and 54 in FIGURE 6, will be formed in the P layer. Ohmic contacts are made to the thus-formed N layers, 44 and 54, the P layer, and the $N^+$ layer composed of the original wafer 14. The contacts are indicated as 46, 47 and 48, respectively, in FIGURE 4, and 56, 57 and 58 in FIGURE 6.

Structures formed, for example, as indicated in FIGURE 4, comprise an original $N^+$ wafer having a resistivity of .002 ohm centimeters and a thickness of 5 mils, a vapor deposited N layer having a resistivity of 1–10 ohm centimeters and a thickness to 5–8 microns, a P layer by diffusion into the vapor deposited N layer of 10 ohm centimeters resistivity and a thickness of 2–3 microns, and an N layer diffused into part of the P layer having a resistivity of .005 ohm centimeters and a thickness of 1–2 microns. After suitable ohmic contacts were made as indicated, the device was tested.

As is apparent, any such semiconductor materials may be used where a vapor source of atoms of the semiconductor material and appropriate active impurity atoms therefor may be obtained. The vapor source must be capable of thermal decomposition and liberation of atoms of semiconductor material at the temperature to which the seed crystal upon which growth will occur may be heated, which temperature cannot exceed the melting point of the seed crystal or any deposited layer thereon. Consistent with these criteria, selection of an appropriate vapor source of the particular semiconductor material desired in any specific layer is possible.

A preferred vapor source for the deposition of single crystal germanium semiconductor bodies by the process of the present invention is germanium tetrachloride. Accordingly, $P^+$-P single crystal germanium semiconductor bodies are produced by first providing a plurality of germanium single crystal wafers having a $P^+$ conductivity type on a conducting support of molybdenum heated to about 850° C. in the reactor described heretofore. Then a hydrogen stream carrying 0.35 percent by volume of germanium tetrachloride and $2.4 \times 10^{-3}$ percent by volume of boron trichloride is added to the reactor. The flow rate is 4.5 liters per minute. Deposition is carried on for about 90 minutes to provide the vapor grown layer of germanium about 0.5 mil thick with a resistivity of 0.1 ohm-cm. P on the $P^+$ germanium substrate.

It should be appreciated that by following the teaching of this invention it is possible to form semiconductor bodies having a plurality of layers of differing conductivities, wherein the width of each layer may be precisely controlled. This allows the transition region or junction, if different type conductivity layers are involved, to be accurately positioned in the semiconductor body. It is also possible to provide in any layer formed any variation in conductivity desired in any plane parallel to the transition region by varying the concentration of vapor source of active impurity atoms in the flow to the reaction chamber during formation of the layer. The benefits from flexibility of such controls, compared to prior art techniques for forming transition regions, are immediately apparent.

In a body formed with a diffused transition region, the conductivity gradient follows Fick's law. In the semiconductor bodies formed in accordance with this invention, the conductivity gradient through the layer can be varied at will by the concentration of active impurity vapor in the gas stream. In a body having a transition region formed by alloying, the depth of the regrowth region (which forms one layer of the semiconductor body) is limited by the amount of semiconductor originally dissolved in the formation of a eutectic mixture with the active impurity. Unless lifetime be seriously impaired, the thickness of the regrowth area is minimal. In common grown junction techniques of pulling a crystal from a doped melt and further pulling from an additionally but opposite-type doped melt, except for the first grown layer uncompensated conductivity layers of low conductivity are not possible. On the other hand, this invention is capable of positioning an intrinsic layer of fixed width at any desired point in the structure and, more particularly, between doped layers. It may be asserted that substantially all variations of structure are now feasible when the invention herein described is employed.

As is illustrated by the devices shown, any desired type of semiconductor device may be made by utilizing the method of the present invention. In each case, the semiconductor device will include at least two layers of semiconductor material having different conductivities and separated by a transition region. In some instances the transition region will be a P-N junction, while in other instances it may be a P-I or an N-I junction and in still other instances it may be a sharp transition region between layers of high and low resistivity material of the same conductivity type. It will be appreciated that where reference is made herein to different conductivities in layers in any assembly thereof, that the difference may be either in kind or in degree. In the case of a P-N junction the layers separated thereby may have the same degree of conductivity (or resistivity) but the type of conductivity will, of course, be different. Alternatively, in the case of, for example, an $N^+$-N transition region the conductivity type will be the same for the layers but the degree of conductivity will, of course, be different. In any case, however, the width of the layers of material and the location and type of the junction or transition region may be very accurately defined and controlled by the method of the present invention.

As indicated above, while the specific techniques of this invention have been described with respect to silicon and germanium as the semiconductor material, it will be appreciated that the invention may be employed in the formation of semiconductor bodies having a plurality of layers of semiconductor material of differing conductivities separated by a transition region, wherein each layer may be the same semiconductor material and other than silicon, for example, silicon carbide, various group III-V compounds such as gallium arsenide, indium-antimonide, gallium phosphide, and the like, and wherein individual layers may be composed of differing semiconductor materials. In the latter instance it is important, of course, that essentially single crystal growth be maintained and hence consideration must be given when depositing layers of dissimilar materials to the crystallography of the layer on which growth occurs and that of the grown layer, thereby preserving the single crystal characteristics to the greatest degree possible.

It will be appreciated that the foregoing description of this invention is detailed for the purposes of illustration but that the invention should not be considered limited to such detail and the scope of the invention should be construed only in accordance with the appended claims.

We claim:

1. The method of simultaneously forming by vapor deposition a plurality of uniform semiconductor bodies having a plurality of layers of single crystal semiconductor material having different conductivities and separated by a transition region which comprises the steps of introducing a plurality of wafers of single crystal semiconductor material having a predetermined conductivity type and degree into sockets of a support within a reaction chamber, heating said wafers to a reaction temperature, introducing a decomposable vapor comprising semiconductor atoms and active impurity atoms to impart a predetermined conductivity to said semiconductor atoms into said chamber, causing said vapor to flow about the exposed surfaces of said heated wafers, and effecting deposition of said atoms from the vapor onto said surfaces to form a uniform single crystal layer of semiconductor material on each of said wafers having a conductivity different from that of said wafer on which deposition occurs.

2. The method in accordance with claim 1 wherein said semiconductor material is silicon.

3. The method in accordance with claim 1 wherein said semiconductor material is germanium.

4. The method of simultaneously forming by vapor deposition a plurality of semiconductor bodies having a plurality of layers of single crystal semiconductor material having different conductivities and separated by a transition region which comprises the steps of introducing a plurality of wafers of single crystal semiconductor material having a predetermined conductivity type and degree into sockets of support so that the exposed surface of said wafers are aligned with said support within a reaction chamber, heating said wafers to a reaction temperature, introducing a decomposable vapor comprising semiconductor atoms and active impurity atoms to impart a predetermined conductivity to said semiconductor atoms into said chamber, causing said vapor to flow about the exposed surfaces of the thus-heated wafers, and effecting deposition of said atoms from the vapor simultaneously on each of the surfaces of the plurality of wafers and on the support thereby maintaining the surfaces of both in substantial alignment during deposition to form a uniform single crystal layer of semiconductor material on each of said wafers having a conductivity different from that of said wafer on which deposition occurs.

5. The method in accordance with claim 4 wherein said semiconductor material is silicon.

6. The method in accordance with claim 4 wherein said semiconductor material is germanium.

References Cited in the file of this patent

UNITED STATES PATENTS

| | | |
|---|---|---|
| 2,650,564 | Fink | Sept. 1, 1953 |
| 2,692,839 | Christensen et al. | Oct. 26, 1954 |
| 2,763,581 | Freedman | Sept. 18, 1956 |
| 2,785,997 | Marvin | Mar. 19, 1957 |
| 2,789,068 | Maserjian | Apr. 16, 1957 |
| 2,895,858 | Sangster | July 21, 1959 |
| 2,989,941 | Wolf | June 27, 1961 |
| 3,065,116 | Marinace | Nov. 20, 1962 |

FOREIGN PATENTS

| | | |
|---|---|---|
| 1,029,941 | Germany | May 14, 1958 |